United States Patent [19]

Kaito et al.

[11] Patent Number: 5,754,041
[45] Date of Patent: May 19, 1998

[54] DEVICE FOR MEASURING VOLTAGE/CURRENT CHARACTERISTICS WITH MEANS TO PREVENT OUTPUT TRANSIENTS DURING CHANGES IN SETTINGS

[75] Inventors: Noboru Kaito; Susumu Takagi, both of Tokyo, Japan

[73] Assignee: Hewlett-Packard Company, Palo Alto, Calif.

[21] Appl. No.: 616,142

[22] Filed: Mar. 14, 1996

[30] Foreign Application Priority Data

Mar. 17, 1995 [JP] Japan ................. 7-086204

[51] Int. Cl.$^6$ .................................................. G01R 31/28
[52] U.S. Cl. ........................................ 324/158.1; 324/765
[58] Field of Search ........................... 324/73.1, 158.1, 324/765; 371/15.1, 22.1, 22.4, 20.1; 437/8; 364/551.01, 571.01, 550; 438/14, 17; 257/40, 48

[56] References Cited

U.S. PATENT DOCUMENTS 5,206,582  4/1993  Ekstedt et al. ................ 324/73.1

OTHER PUBLICATIONS

Hewlett-Packard Journal, Oct. 1982, Susumu Takagi et al., pp. 15–20, "Programmable Stimulus/Measurement Units Simplify Device Test Setups".

*Primary Examiner*—Vinh P. Nguyen

[57] ABSTRACT

A measurement device measures voltage/current characteristics of a device under test (DUT) and suppresses spikes and overshoots which appear in an output when voltage and current settings fed to the DUT are changed, and makes possible rapid setting changes. The measurement device has a V holding loop which contains a capacitor, an error amplifier, an FET switch, a voltage-current converter, an integrator, a power amplifier, a current ranging circuit and a buffer amplifier. During ordinary operation of the circuit, the FET switch is on and the output voltage is remembered by the capacitor. When the voltage-current settings are changed, the FET switch is off, the feedback circuit of the V holding loop is formed, and the value of the output voltage immediately before the changes were performed is held, on the basis of the voltage of the capacitor. During this time, the voltage and current values are changed; and when the changes are complete, the feedback circuit of the V holding loop is cut; and the circuit is returned to its normal operating state.

13 Claims, 6 Drawing Sheets

DEVICE FOR MEASURING VOLTAGE/CURRENT CHARACTERISTICS WITH MEANS TO PREVENT OUTPUT TRANSIENTS DURING CHANGES IN SETTINGS

FIELD OF THE INVENTION

In general, this invention concerns a method for reducing spikes and overshoots that appear in an output of a measuring instrument when output voltage or output current settings are changed and a method for shortening the time required for changing the settings of voltage or current; and in particular, it concerns a device for measuring voltage/current characteristics of semiconductor direct current parameters.

BACKGROUND OF THE ART

In recent years, there has been striking progress in miniaturization of semiconductor technology, but a consequence of this development has been that semiconductor devices have become weaker and more subject to stress. Therefore, devices for measuring semiconductors are required to put no unnecessary stress on the semiconductors being measured. Moreover, there has been a demand for a shortening of the time needed for testing the products, especially in semiconductor test devices used in manufacturing lines. Therefore, it has become necessary to shorten the time required for switching between measurement actions.

Devices for measuring voltage/current characteristics, are used to measure semiconductor direct current (DC) parameters. Such devices measure the current flowing in a device under test (DUT) by applying a voltage to the DUT from a constant-voltage source, and measure the voltage between the ends of the DUT by allowing a current to flow therein from a constant-current source.

Furthermore, devices for measuring voltage/current characteristics are used as parametric measurement units (PMU) in the field of semiconductor circuit test devices and as source measurement units (SMU) in the field of semiconductor direct-current parameter measurement devices.

Figure 4:
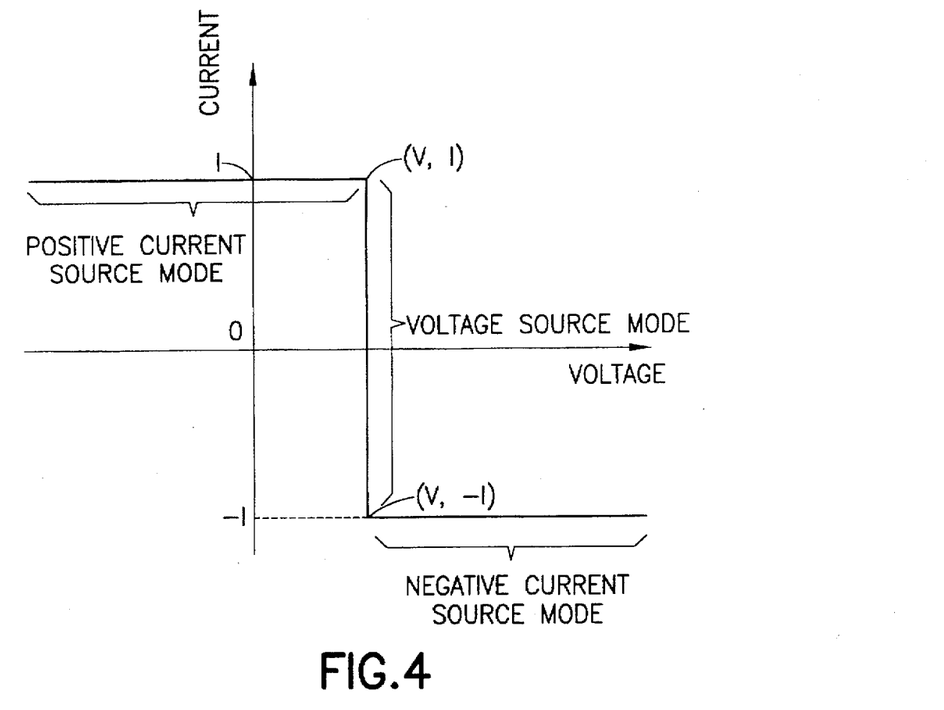
FIG. 4: Diagram showing the output mode of a measurement device.

In order to perform such measurements, devices for measuring voltage/current characteristics use three modes, a constant-voltage source mode, a positive constant-current source mode, and a negative constant-current source mode. In each of these modes, a power source is connected with the DUT and the voltage or current is measured. FIG. 4 shows a diagram of these modes, with the voltage as the horizontal axis and the current as the vertical axis.

In the constant-voltage source mode, the absolute value of the output current is in the range of I or less and the output voltage is at a constant value V (here, I and V are positive numbers). That is, the vertical line connecting the coordinates (V, I) and (V, −I) in FIG. 4 shows the constant-voltage source mode. Furthermore, it is not necessary for the absolute values of the positive and negative I to be equal, but here they are assumed to be equal in order to simplify the explanation given below.

In the positive constant-current source mode, the output voltage is in the range of V or less and the output current is at a constant value I. In FIG. 4, the line parallel to the horizontal axis stretching left from the point (V, I) shows the positive constant-current mode. In the negative constant-current source mode, the output voltage is in the range of V or greater and the output current is at a constant value −I. In FIG. 4, the line parallel to the horizontal axis stretching right from the point (V, −I) shows the negative constant-current mode. The crank-shaped folded line combining these three modes shows the voltage/current characteristics of the measurement device. In other words, the measurement device is always operated at the some point on the folded line, which means either the voltage or the current is kept constant.

Figure 5:
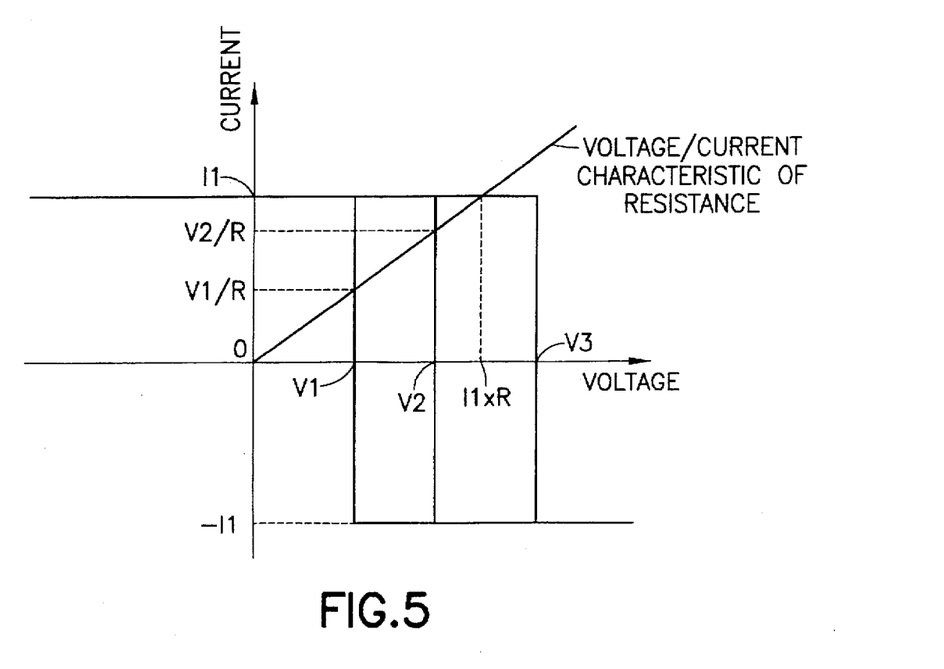
FIG. 5: Diagram showing an example of a transition between output modes of a measurement device.

Here, the V of the aforementioned constant-voltage source is called the control voltage value and the I of the constant-current source is called the control current value. Either of the control voltage or current value is kept constant at certain values. Furthermore, which mode the power source is operated at the present depends on the resistance value of the DUT. In FIG. 5, the relationship is shown of the resistance value of the DUT to the determination of the mode. FIG. 5 also shows the manner in which the mode makes a transition due to the change of V or I.

The DUT in FIG. 5 is a resistor with a resistance value of R; and in this example, the other end is grounded. The voltage/current characteristic is shown by a straight line with a slope of 1/R, rising to the right. The intersections of this line with the folded lines (which show the voltage/current characteristics of the measurement device) are the operating points of the resistor, as well as the operating points of the measurement device. Moreover, the parts of the folded line in which the operating points are show the modes of the measurement device.

In FIG. 5, at first, the measurement device is set to V=V1 as the control voltage value and I=I1 as the control current. As a result, a current of V1/R (where V1/R is equal to or lower than I1) is caused to flow through the resistor in the constant-voltage source mode. And, the control voltage value V is changed to V2 (where V2 is I1 times R or less). Then the measurement device is operated at the current V2/R and the voltage V2 in the constant-voltage source mode. Note that since the current value V2/R is at or below I1, the mode does not change, and only the current value changes to a new value. Next, the control voltage value V is changed to V3. In this case, V3/R is made greater than I1.

At this time, as the measurement device cannot output the current V3/R in the constant-voltage source mode, the mode goes through a transition, becoming the constant-current source mode, and the operation falls to the operating point of the output current I1 and the output voltage I1 times R.

The example described above is one in which, since the measurement device is in the constant-voltage source mode, with a control voltage value of V1, the control voltage value is changed and a transition is made to the constant-current source mode. However, it is also possible to change the mode by changing the control current value. In the constant-voltage source mode in the initial state of FIG. 5, if the control current value is changed from I1 to a value of V1/R or lower, it can be seen that there is a transition to the constant-current source mode.

While no examples will be shown in which the initial state is the constant-current source mode and which exhibit a transition to the constant-current source mode when the control voltage value or control current value is changed, it is to be understood that the transition occurs in the same manner as described above.

Figure 3:
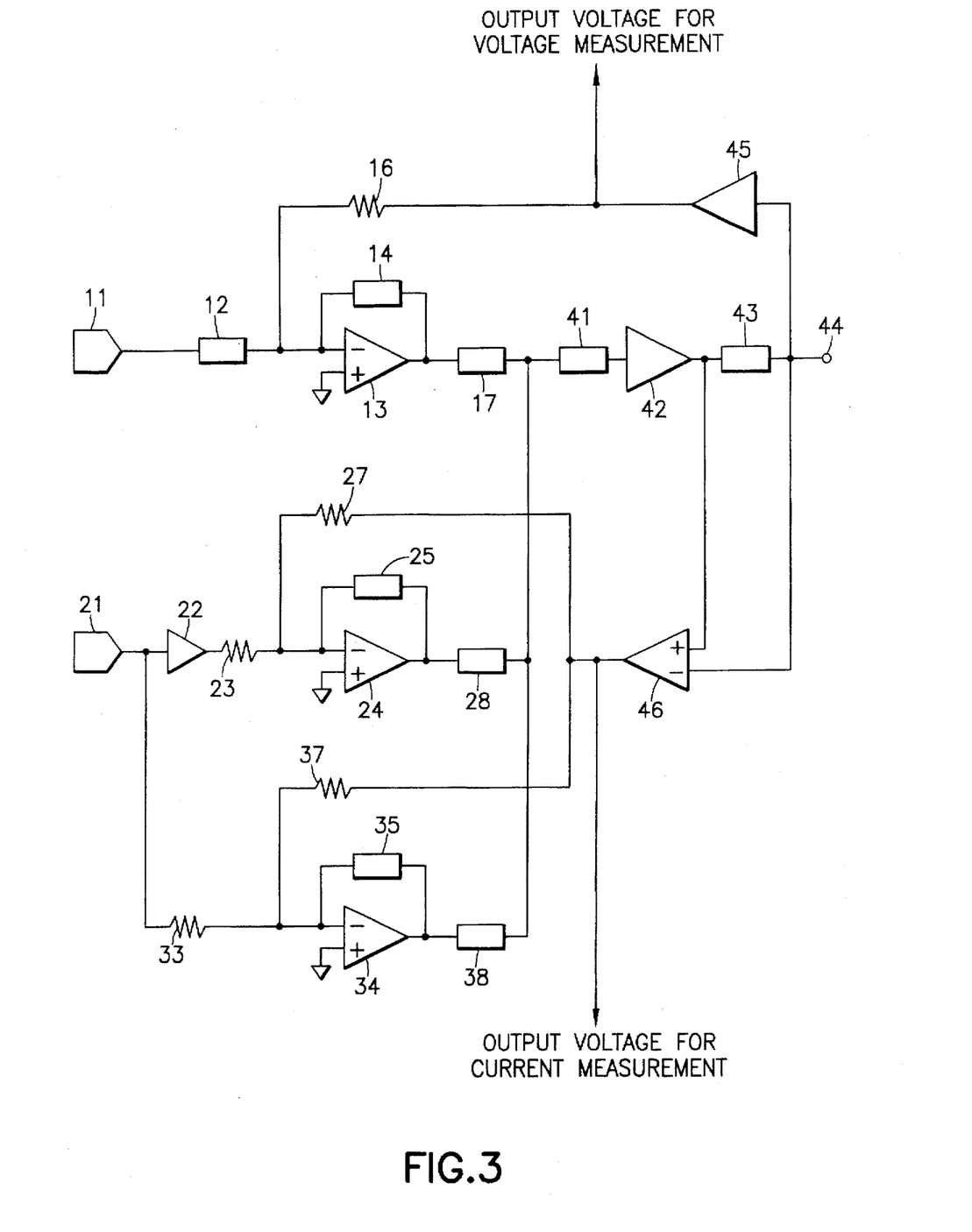
FIG. 3: Diagram showing a fundamental embodiment of the prior art.

FIG. 3 shows a fundamental prior art structural diagram of a measurement device. FIG. 3 shows only the fundamental operation of the measurement device and the structural elements which are related to this invention, to be described below. Structural elements such as the correction means, e.g., the feedback circuits, range switching circuits, and the operation control circuit which perform various kinds of signal processing and control, are omitted.

In order to realize the constant-voltage source mode, positive constant-current source mode, and negative constant-current source mode with the voltage/current characteristics described above, the measurement device is provided with feedback loops, known as the V loop, the Ip loop, and the In loop, corresponding to these 3 modes, respectively. In FIG. 3, the V loop is a feedback loop consisting of a Digital to Analog converter 11, a voltage ranging circuit (a circuit of ranging resistors for voltage) 12, an error amplifier 13, a voltage-current converter 17, an integrating means 41, a power amplifier 42, a current ranging circuit (a circuit of ranging resistors for current) 43, a buffer amplifier 45, and a resistor 16.

Terminal 44 is the output terminal of the measurement device; the object to be measured is connected between this terminal and ground, or the output terminal of another measurement device.

The Ip loop is a feedback loop consisting of a Digital to Analog converter 21, a inverting amplifier 22, a resistor 23, an error amplifier 24, a voltage-current converter 28, integrating circuit 41, power amplifier 42, current ranging circuit 43, a differential amplifier 46, and a resistor 27. The In loop is a feedback loop consisting of Digital to Analog converter 21, a resistor 33, an error amplifier 34, a voltage-current converter 38, integrating circuit 41, power amplifier 42, current ranging circuit 43, differential amplifier 46, and a resistor 37.

Furthermore, FIG. 3 shows an example of the case in which the absolute values of the control currents of the positive and negative constant-current modes are equal. When they are not equal, inverting amplifier 22 is unneeded, and a reference voltage is applied to resistor 33 from another Digital to Analog converter (not 21).

Voltage ranging circuit 12 and current ranging circuit 43 are ordinarily formed from a number of ranging resistors and FET switches that switch among them. Voltage ranging circuit 12 sets the range of the control voltage value, and Digital to Analog converter 11 sets the voltage value within this range.

Integrating circuit 41 is ordinarily formed from a capacitor connected between the power amplifier input and ground. Clamping circuits 14, 25, and 35 are connected, respectively, between the inputs and outputs of the error amplifiers 13, 24, and 34. The outputs of the error amplifiers are thus controlled to be no higher than clamping voltages (Vc) which are determined by the clamping circuits.

Figure 6:
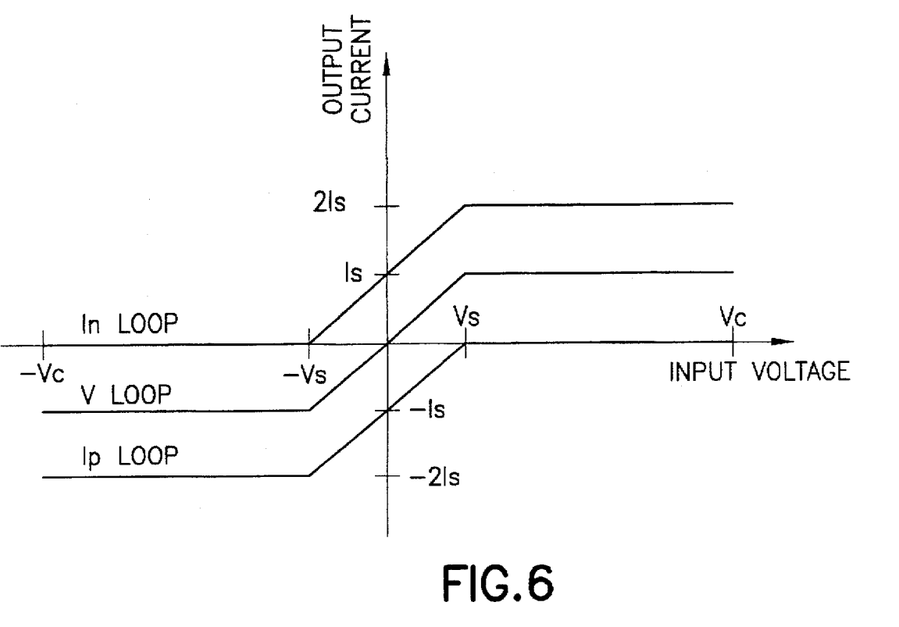
FIG. 6: Diagram showing the input voltage and output current characteristic of a voltage-current converter

FIG. 6 shows the relationship between input voltages and output currents of the voltage-current converters 17, 28, and 38 (in FIG. 3). The output current changes almost in proportion to the input voltage, but it is set in such a way that it is saturated if the absolute value of the input voltage exceeds the range above Vs. Voltage-current converter 17 of the V loop has a characteristic which is almost point-symmetrical with respect to the origin and the magnitude of the saturation current Is. In voltage-current converter 28 of the Ip loop, however, a bias of –Is is applied to the characteristic of voltage-current converter 28, so that the saturation current of the positive voltage side is almost zero. Voltage-current converter 38 of the In loop has a characteristic to which a bias of +Is is applied. Furthermore, the input voltage does not go above the clamping voltage Vc of the aforementioned error amplifier. The slopes of the inclined parts of the input/output characteristics of these voltage-current converters need not be equal.

Next, the operations of each loops will be discussed with FIG. 3. First, it is assumed that the V loop performs feedback control. The difference between the voltage returned from output terminal 44 to the input of error amplifier 13 (through buffer amplifier 45 and resistor 16), on the one hand, and the voltage added by the voltage of Digital to Analog converter 11 to the input of error amplifier 13 through voltage ranging circuit 12, on the other hand, is amplified by error amplifier 13, and a current corresponding to the voltage difference is output from voltage-current converter 17. This current is integrated by integrating circuit 41, and becomes the input to power amplifier 42. By means of this negative feedback of the V loop, the ratio of the voltage at output terminal 44 to the voltage of Digital to Analog converter 11 is equilibrated, so that it becomes equal to the ratio of resistance 16 and the resistance value of voltage ranging circuit 12. In this state, since the output voltage is constant, i.e., the input voltage of the power amplifier 42 is kept almost constant, the current which is input into integrating circuit 41 is almost zero.

On the other hand, when the V loop performs feedback control, the output current has a smaller value than the control current value, so that the input to error amplifier 24 of the Ip loop becomes a negative voltage, with a magnitude which saturates error amplifier 24. Therefore, the output of error amplifier 24 is clamped to positive voltage Vc by clamping circuit 25. Moreover, error amplifier 34 of the In loop is also clamped to –Vc for the same reason, but with an inverted polarity.

The Ip and In loops thus come to be in states in which feedback control is not possible. At such time, the input voltages of voltage-current converters 28 and 38 of the Ip and In loops are Vc and –Vc, respectively. Therefore, the output current is almost zero, as shown in FIG. 6. The sum of the currents of the three voltage-current converters is a current which is input into integrating circuit 41, and the current of voltage-current converter 17 is micro-regulated so that current flow becomes almost zero, and the feedback circuit is equilibrated.

When the Ip or In loop performs feedback control, the process is the same as in the case of the V loop, except for the points mentioned hereafter. That is, the feedback voltage is not the output voltage; and a voltage proportional to the current of the ends of the current ranging circuit 43 is fed back. The resistors 23 and 33 in the positions corresponding to the voltage ranging circuit do not require range switching. Moreover, because of the Ip loop and the In loop, which have different polarities, an inverting amplifier 22, which inverts the polarity of Digital to Analog converter 21, is provided. Furthermore, the output current of the voltage-current converters are not zero in the state in which the feedback circuits are equilibrated; rather, the sum of the whole becomes zero. The details will be omitted, however.

The measurements of the voltage and current are performed by the following method. Since the input impedance of differential amplifier 46 is almost infinitely large, the output voltage is proportional to the output current of the measurement device. This voltage is measured by a voltmeter, not shown in the figure, and the current value that is flowing in the object being measured can be obtained. Since the output voltage of buffer amplifier 45 is equal to the output voltage of the measurement device, this voltage is measured by a voltmeter not shown in the figure, and the voltage value of the object being measured can be obtained.

The operation of switching from one of the three modes mentioned above to the others will be discussed by an example of switching from the constant-voltage source mode to the constant-current source mode, as shown in FIG.

5. First, assume that the control voltage value is V1, the control current value is I1, and the constant-current source mode is being used. At this time, the V loop is performing feedback control and is in the equilibrium state; the error amplifiers of the Ip loop and the In loop are clamped.

Here, if it is assumed that the control voltage value is increased to V3, the output voltage is increased by the feedback control operation of the V loop, and the output current is increased, so that it tries to exceed the control current value I1. At this time, the input voltage of error amplifier 24 of the Ip loop approaches zero, error amplifier 24 is released from the clamped state, and the input voltage of voltage-current converter 28 is also released from the saturated state. When the input voltage falls, voltage-current converter 28 absorbs the current from the integrating circuit, as shown in FIG. 6, since it comes to be in a state in which it absorbs current. On the other hand, in the In loop, the clamped state continues, because the set current and the output current differ greatly and the current of voltage-current converter 38 holds the zero state. As a result, the Ip loop lowers the input voltage of power amplifier 42, and acts in a direction to further lower the output voltage.

In the V loop, on the other hand, since the output voltage is still lower than the set voltage V3, the output of error amplifier 13 increases and tries to cause a flow of output current from voltage-current converter 17. Here, voltage-current converter 17 and voltage-current converter 28 act in opposite directions but since, as shown in FIG. 6, the upper limit Is at which current can flow from voltage-current converter 17 is smaller than the upper limit of the current which voltage-current converter 28 can absorb (almost 2*Is), voltage-current converter 17 is saturated first. Finally, error amplifier 13 also raises its output until it is clamped, and the situation is reached that feedback control is impossible.

Thus, in the state in which the saturation current of voltage-current converter 17 is absorbed by voltage-current converter 28, the feedback circuits are equilibrated, the V loop is released from the state of constant-voltage control and enters a state in which the Ip loop exerts constant-current control, and the output current is held at a constant value.

When the voltage setting is changed from V1 to V2, the error voltage of the input of error amplifier 24 of the Ip loop does not approach zero; therefore, the voltage control state of the V loop is kept, and the voltage becomes V2.

As described above, the measurement device has several feedback circuits to perform the constant-voltage source mode, the positive constant-current source mode, and the negative constant-current source mode. Because of the fact that the frequency responses of these feedback circuits are limited and they contain poles of multiple degrees, if even one of the parameters is changed, that determines the states of the feedback circuits which are in an equilibrium state, spikes or overshoots are produced in the output. When the mode of the power source changes, the several feedback circuits exchange their saturated or clamped feedback-operation-stopped states and their feedback-control-operating states, and therefore especially large spikes and overshoots are produced. These spikes and overshoots put stress on the semiconductors being measured.

Various methods for suppressing spikes and overshoots have been devised. Examples of these will be described below.

(a) The method of putting filters on the outputs of the Digital to Analog converters:

This is a method of suppressing rapid changes in the feedback loops by inserting low-pass filters into the outputs of the Digital to Analog converters which set the control voltage and control current values.

(b) The method of making the Digital to Analog converter output temporarily zero when the voltage range is changed:

Changing the range of the control voltage value is performed by changing the resistors (not shown in the figure) in the voltage ranging circuit 12. In order to prevent spikes and overshoots during the range switching in the fixed-voltage source mode, the setting of Digital to Analog converter 11 is temporarily made zero. The range resistor is switched and then the Digital to Analog converter is set to the desired value. (c) The method of make-before-break switching in the voltage ranging circuit:

In the case of changes in settings which accompany changes in the control voltage value (in the constant-current source mode), and in cases in which it is predicted that a mode transition will occur if the voltage value becomes small, switches of resistors (not shown in the figure) of the voltage ranging circuit is a make-before-break switches. In this way, the two ranging resistors before and after the switching are temporarily connected in parallel at the moment of switching, so that the output current does not swing lower during the switching. Therefore, unnecessary loop transitions during ranging resistors switching are prevented, and the production of spikes and overshoots is minimized.

(d) The method of break-before-make switching in the voltage ranging circuit:

In the case of changes in settings which accompany changes in the control voltage value in the constant-current source modes and when it is predicted that a mode transition will be produced if the voltage value becomes large, the switches of resistors (not shown in the Figure) of the voltage ranging circuit is made a break-before-make switch. In this way, the ranging resistance value does not become small, temporarily, during the switching, and the output voltage does not swing higher. Therefore, unnecessary loop transitions during switching of ranging resistors are prevented, and the production of spikes and overshoots is minimized.

(e) The method of constant-voltage source mode conversion:

In cases in which a resistor of current ranging circuit 43 is switched when the device is in a constant-current source mode, the control voltage value is changed so that the operating point presently in effect hardly changes at all, and the device is put forcibly into the constant-voltage source mode. After this, the resistor of the current ranging circuit is switched.

(f) The method of cutting the I loop:

In cases in which setting changes, accompanying switches in the resistors of the current ranging circuit, occur when the device is in the constant-voltage source mode, the voltage-current converters of the Ip loop and the In loop are put into states in which their functions are stopped and the feedback loops of the Ip and In loops, respectively, are cut. After the setting changes related to the current are made, and all the changes are completed, the feedback loops of the Ip and In loops are restored.

(g) The method of soft switching:

Since the current ranging circuit 43 also becomes a constituent element of the V loop, even when the functions of the voltage-current converters of the current loops are stopped, spikes or overshoots appear in the output when the current ranging resistors is switched. Therefore, the FET switch which switches the current ranging resistors is driven by a ramp voltage waveform, so that the change in ranging resistors becomes slower than the frequency response of the V loop.

The purpose of suppressing spikes and overshoots can be accomplished by combining the aforementioned prior art technologies and selecting suitable ones in accordance with whatever the existing situation may be. However, these technologies have the following problems.

(1) A number of switches must be operated to perform one setting change. Therefore, time is required for setting changes.

(2) Since low-pass filters of the Digital to Analog converters, soft switches, etc., perform setting changes gradually, time is required for setting changes.

(3) Since it is necessary to observe the mode presently in effect, to predict the mode after the setting change, to select a suitable method from the various methods of change mentioned above, and switch the order of the operations, the control becomes complex, and a large burden is placed on the firmware of the device.

(4) The demand of the marketplace, i.e., shortening the measurement time, cannot be satisfied, due to (1) and (2) above.

SUMMARY OF THE INVENTION

This invention provides a measurement device that can suppress spikes and overshoots and can make possible rapid setting changes. Furthermore, it simplifies the complex control at the time of setting changes of the prior art, and reduces the burden on the firmware which performs the control.

This invention contains a new V holding loop in addition to the V loop, Ip loop, and In loop of the prior art. This loop remembers the output voltage in an output voltage memory circuit when the ordinary operations are being performed. When the control voltage and current values are changed, a feedback circuit of the V holding loop is formed, and the feedback circuit holds the output voltage at the value immediately before the change, using the remembered voltage of the output voltage memory circuit as the reference. During this time, either the control voltage value or the control current value, or both, can be changed. When the change is completed, the feedback circuit of the V holding loop is cut, and the measurement device is returned to its ordinary operating state.

EXPLANATION OF SYMBOLS

1: Capacitor
2: Resistor
3: Error amplifier
4: FET switch
5: FET switch
6: Clamping circuit
7: Voltage-current converter
11: Digital to Analog converter
12: Voltage ranging circuit
13: Error amplifier
14: Clamping circuit
15: FET switch
16: Resistor
17: Voltage-current converter
21: Digital to Analog converter
22: Inverting amplifier
23: Resistor
24: Error amplifier
25: Clamping circuit
26: FET switch
27: Resistor
28: Voltage-current converter
33: Resistor
34: Error amplifier
35: Clamping circuit
36: FET switch
37: Resistor
38: Voltage-current converter
41: Integrating circuit
42: Power amplifier
43: Current ranging circuit
44: Output terminal
45: Buffer amplifier
46: Differential amplifier
110,112,114,116,120,122,124,126,128,130,132,134: Blocks

DETAILED DESCRIPTION OF A PREFERRED EMBODIMENT

Figure 1:
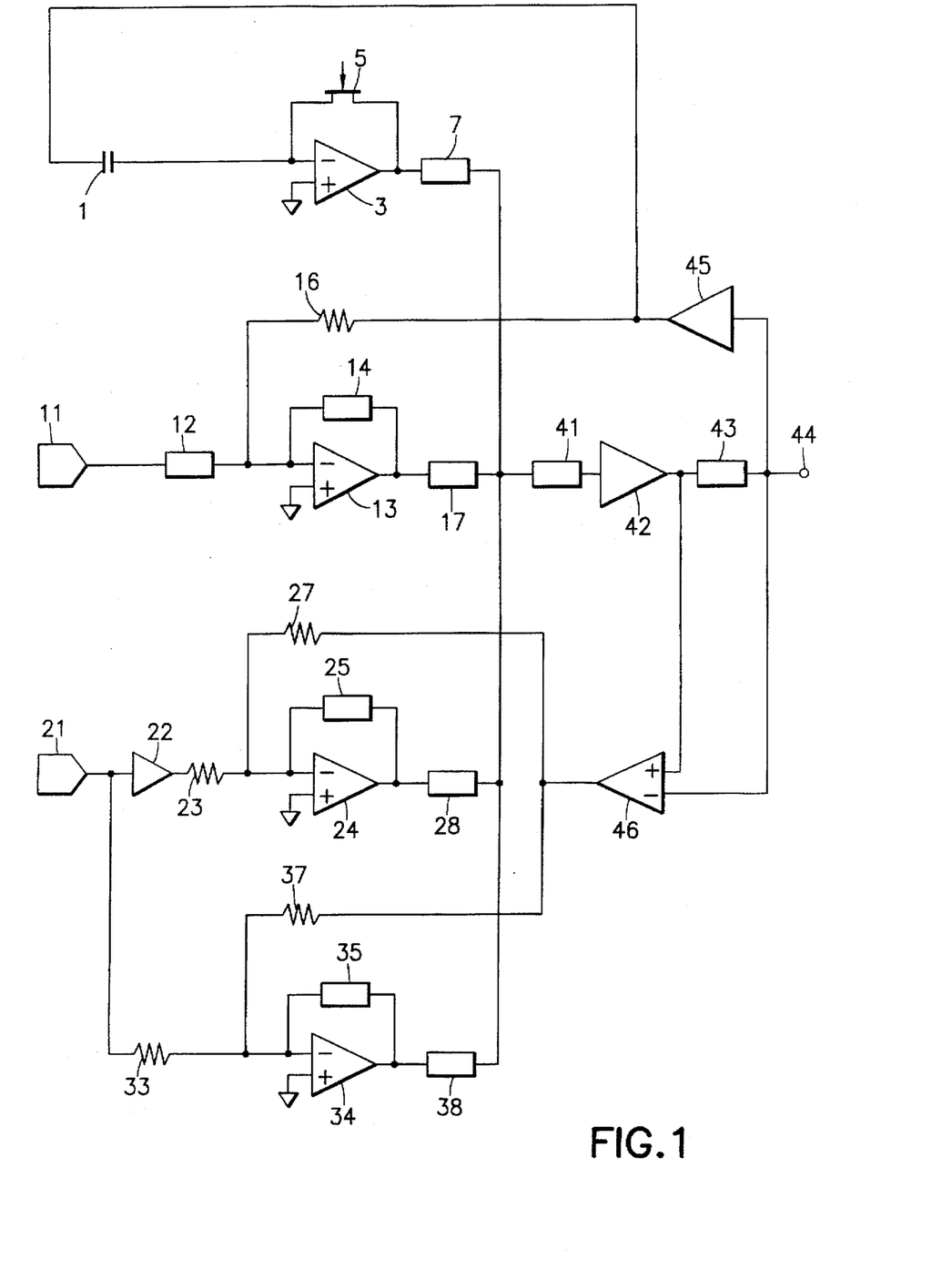
FIG. 1: Diagram showing a fundamental embodiment of an example of this invention.

The fundamental embodiment of the invention is shown in FIG. 1. The constituent elements with the same functions as in the prior art circuits are given the same numbers. Furthermore, in FIG. 1, structural elements such as the correction means in the feedback circuits, the range switching, and the current source control parts which perform various kinds of signal processing and control, are omitted. The fundamental embodiment of the invention in FIG. 1 is controlled to switch or change various settings of modules by digital control signals. Measurement modules, CPU and control lines for switching and changing various settings of voltage and/or current are also omitted in FIG. 1.

The fundamental embodiment of the V holding loop is a loop including a capacitor 1 (which is the output of the voltage memory circuit), an error amplifier 3, an FET switch 5, a voltage-current converter 7, integrating circuit 41, power amplifier 42, current ranging circuit 43, and buffer amplifier 45. Integrating circuit 41, power amplifier 42, current ranging circuit 43, and buffer amplifier 45 are loop constituent elements which are common to this loop and the V loop, Ip loop, and In loop of the prior art.

The V holding loop has two states of operation, an output voltage tracking operation and an output voltage holding operation. The output voltage holding operation is the operation performed while the control voltage and current values of the device are changed. Its purpose is to hold the output voltage at a constant value. The output voltage tracking operation is performed during the ordinary operating state of the device, when the changes made in the device have been completed; and its purpose is to track and remember the output voltage.

In the output voltage tracking operation, the FET switch 5 is closed and the feedback loop of the V holding loop is cut, so that the feedback control operation is stopped.

Figure 8:
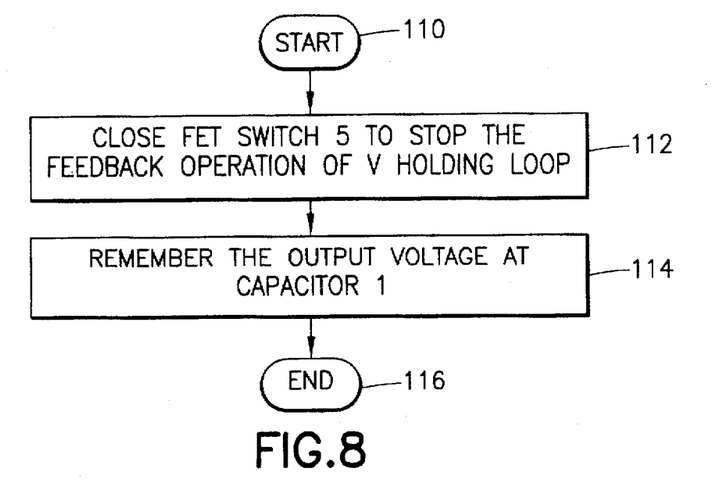
FIG. 8: Flow diagram showing a method for remembering the output voltage at the V holding loop in the output voltage tracking operation of a fundamental embodiment illustrated in FIG. 1

When FET switch 5 is closed, error amplifier 3 is in a total feedback state and its input/output terminals are kept at zero potential; therefore, the feedback loop is cut. Since the input terminal of error amplifier 3 is kept zero, the potential of the terminal on the error amplifier side of capacitor 1 is zero. Moreover, the other terminal of capacitor 1 constantly has a voltage applied to it from buffer amplifier 45 which is equal to the output voltage of the measurement device. As a result, capacitor 1 is constantly charged with a voltage equal to the output voltage. Actions described above are shown in FIG. 8.

Figure 7:
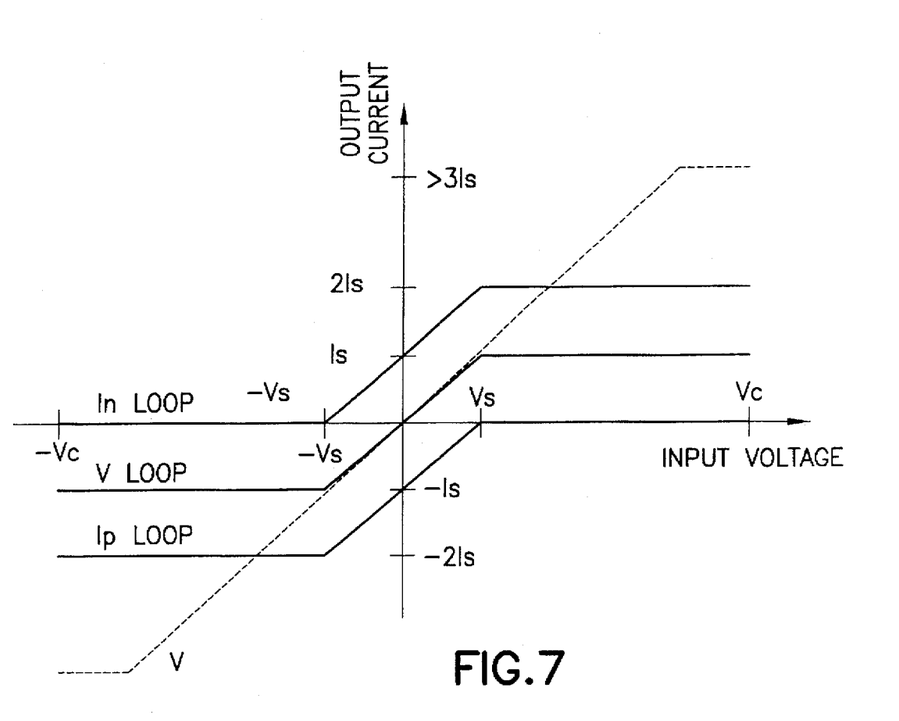
FIG. 7: Diagram showing the input voltage and output current characteristic of a voltage-current converter

When the control voltage and current values of the measurement device are changed, FET switch 5 is opened, the feedback loop of the V holding loop is activated and the operation is switched to the output voltage holding operation. The voltage-current converter 7 of this loop is set with a wider dynamic range of current output than the voltage-current converters of the V loop, Ip loop, and In loop, as shown by the dotted line in FIG. 7. That is, the current value at the time of saturation is set at a value exceeding three times the saturation current (Is) of voltage-current converter 17.

When the V holding loop forms the feedback loop, the voltage differential between the voltage charge on capacitor 1 and the output voltage of buffer amplifier 45, is input into error amplifier 3. The V holding loop is then controlled by feedback, so that it tries to keep the voltage differential at zero. The V loop or I loop (which determined the output voltage before this by exercising feedback control) and the V holding loop compete to control the output voltage simultaneously. But, the voltage-current converters of the V loop or I loops, which have smaller dynamic ranges, become saturated first, and ultimately the V holding loop exerts control. Moreover, the error amplifier of the loop, which was performing feedback control, is clamped.

Figure 9:
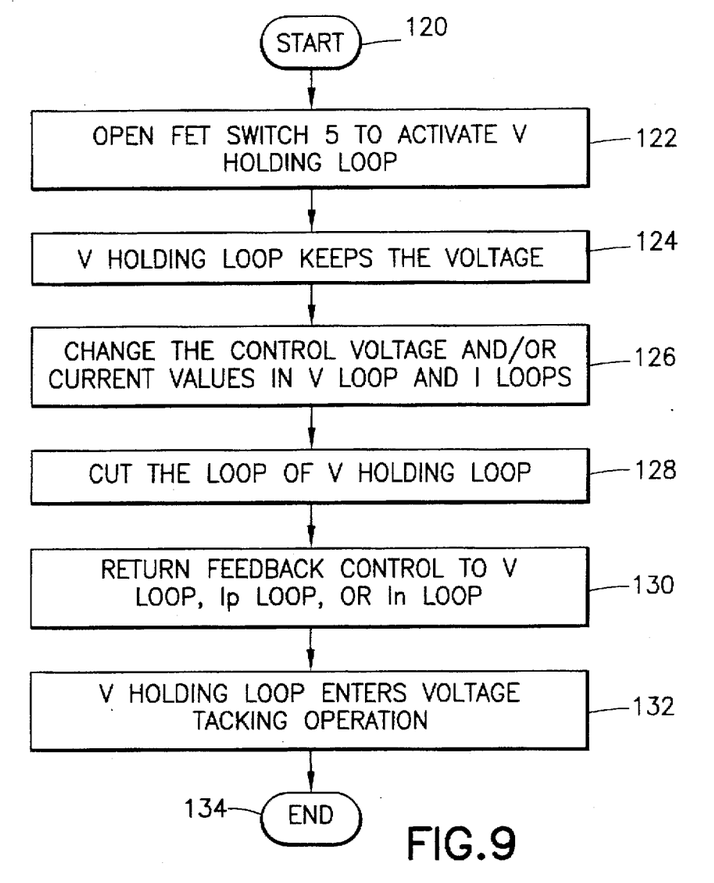
FIG. 9: Flow diagram showing a method for changing settings of outputs when the V holding loop is in the output voltage holding operation for a fundamental embodiment illustrated in FIG. 1

At this time, when feedback control passes to the V holding state, no effect appears in the output, even though the control voltage and/or control current values are changed at the same time. After the changes are completed, the loop of the V holding loop is cut, whereupon the feedback control returns to the V loop, Ip loop, or In loop, according to the new values. Furthermore, again the V holding loop enters the voltage tracking operation by cutting the V holding feedback loop. Actions described above are shown in FIG. 9.

Figure 2:
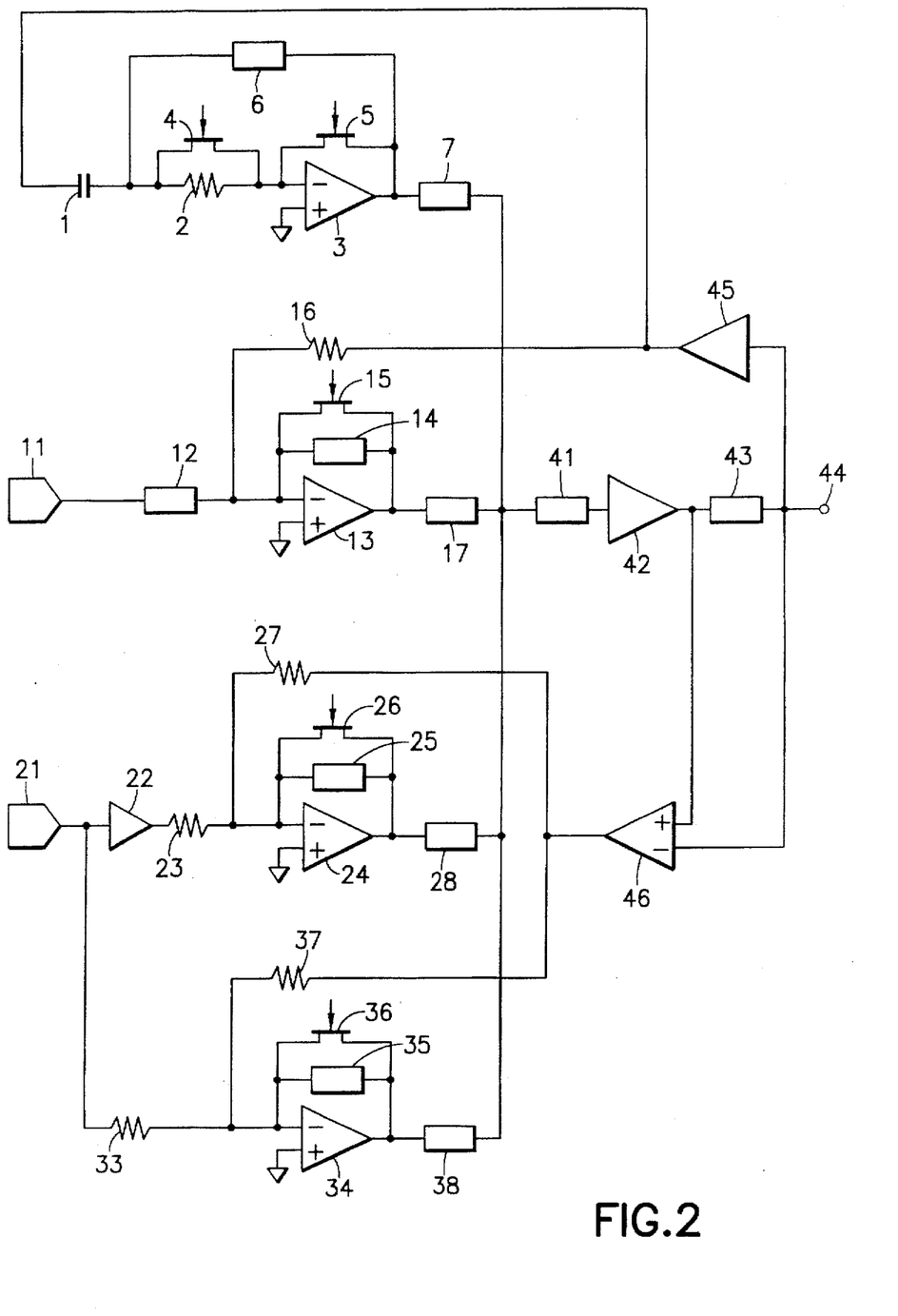
FIG. 2: Diagram showing a more detailed embodiment of the example of this invention.

By means of the operation of the V holding loop, spikes and overshoots are reduced, but there are cases in which new spikes and overshoots are produced by the transition between the V holding loop and the other loops. FIG. 2 shows an example of the invention which has a means for improving the stability of the feedback operation of the V holding loop and eliminates the spikes and overshoots. In FIG. 2, however, structural elements such as the correction means of the feedback circuits, etc., including the V holding loop, the range switching, and the calculation and control parts which perform various kinds of signal processing and control, are omitted. The fundamental embodiment of the invention in FIG. 2 is controlled to switch or change various settings of modules by digital control signals. Measurement modules, CPU and control lines for switching and changing various settings of voltage and/or current are also omitted in FIG. 2.

In FIG. 2, a resistance 2 is inserted between capacitor 1 and error amplifier 3 of the V holding loop, and an FET switch 4 is connected in parallel across resistance 2. Moreover, a clamp circuit 6 is connected between the connection point of capacitor 1 and resistance 2 and the output terminal of error amplifier 3. Further, FET switches 15, 26, and 36 are connected between the inputs and outputs of the error amplifiers in the V loop, the Ip loop, and the In loop. Their operations are described below.

(A) During the output voltage holding operation of the V holding loop, the functions of the voltage-current converters of the V loop, Ip loop, and In loop are stopped. In this way, spikes which are produced transitionally are prevented. The states of the voltage-current converters in which their functions are stopped are states in which the conversion efficiencies of the voltage-current converters become equivalent to zero. Therefore, methods for realizing this state include cutting the input of the voltage-current converter, cutting the output by controlling the inner part of the voltage-current converter, or cutting the output terminals.

(B) Resistor 2, between capacitor 1 and the input of error amplifier 3, is given a value almost equal to feedback resistor 16 of the V loop, improving the stability of the feedback loop of the V holding loop. During the output voltage tracking operation, resistor 2 is bypassed by closing FET switch 4, so that no holding delay is produced.

(C) If switching between the output voltage holding operation and the output voltage tracking operation of the V holding loop is performed instantly, a new spike is produced by the transfer of the load between FET switches 4 and 5, etc., and therefore the switching timing of FET switches 4, 5, and 7 is regulated by the soft switching method, in which the switching is driven in a ramp wave form.

(D) During the output voltage holding operation of the V holding loop, the error amplifiers of the V loop, Ip loop, and In loop are in clamped conditions, and when the output voltage holding operation is completed, and the device is returned to its normal operation, there are cases in which overshoots are produced. Therefore, during the output voltage holding operation, the inputs and outputs of the error amplifiers 13, 24, and 34 are bypassed by closing FET switches 15, 26, and 36, respectively.

(E) A clamping circuit 6 is connected to the V holding loop to prevent the FET switches from operating mistakenly during the output voltage holding operation.

By the method described above, spikes and overshoots are eliminated, and high-speed setting changes are made possible by a simple control. The time required for changing settings, which was from several ms to about 10 ms in the prior art, can be shortened to 1/100f this time or less. As a result, semiconductor characteristics can be measured at high speed. Furthermore, the switching of the control methods according to the present state and the state predicted after the setting, which was required by the prior art, is made unnecessary. Therefore, control by firmware can be greatly simplified, and shortening of the development time is realized.

An actual example of this invention was described above, but this invention is not limited by the mode, arrangement, or other aspects of this example; if desired, changes in the embodiment of this example are permitted, as long as the concept of this invention is not lost.

We claim:

1. A measurement device comprising:

a current ranging circuit, having a first end and a second end, said second end connected to an output terminal, for detecting an output current flowing to a device under test (DUT) through said output terminal;

a power amplifier for driving the first end of the current ranging circuit;

an integrating circuit connected to the power amplifier;

a first control means, including an output voltage detection means for detecting a voltage at the output terminal, and providing an output indicative thereof to a first error amplifier to which a reference output voltage is connected through a voltage ranging circuit, said first error amplifier connected to the integrating circuit through a voltage-current converter;

at least a second control means, including output current detection means for detecting voltage at the first and second ends of the current ranging circuit, and providing an output indicative thereof to a second error amplifier, to which a reference voltage produced by an output current through a resistor is also connected, said second error amplifier connected to the integrating circuit through a voltage-current converter;

a third control means including a voltage memory means, a first end of which is connected to the output voltage detection means and a second end of which is connected to an input of a third error amplifier; and a control switching means, connected between an input and output of the third error amplifier, the third error amplifier further connected to the integrating circuit through a voltage/current converter;

said control switching means enabling the first control means or the second control means to control the output voltage or output current and, in such case switching the third control means to a state in which the voltage memory means remembers the voltage of the output voltage detection means and the aforementioned output voltage is remembered; and when set values of either or both of the output voltage and output current are changed, first, the third control means is switched by the control switching means to a state to control the output voltage and then enables said third control means to hold the output voltage at the voltage remembered by the voltage memory means, and further causes the first and second control means to stop controlling, thereby enabling a subsequent changing of a voltage range, a reference voltage for the output voltage, a current range, and/or a reference voltage for the output current; and after a transitional period of setting changes is completed, the control switching means stops the control operation of the third control means and enables a resumption of control by the first or second control means, and further operates the third control means to resume holding the voltage of the output voltage detection means.

2. A measurement device in accordance with claim 1, wherein:

the voltage memory means is a capacitor and the control switching means of the third control means is an FET switch; and said third control means, upon operation by said control switching means, (i) closes the FET switch to enable a charging of the capacitor to a voltage corresponding to the output voltage, and (ii) opens the FET switch to enable use of the capacitor voltage as a reference.

3. A measurement device in accordance with claim 1, wherein:

the output voltage detection means is connected to a first terminal of a capacitor, and a second terminal of the capacitor is connected to an input terminal of the third error amplifier through a resistor, the input and output of the third error amplifier are connected by a first FET switch and ends of the resistor are connected by a second FET switch, an output of the third error amplifier is connected to the integrating circuit through the voltage-current converter; and the control switching means closes the first FET switch and second FET switch, to enable a charging of the capacitor to a voltage corresponding to the output voltage, and thereafter opens the first FET switch and second FET switch, and enables the capacitor voltage charge to be used as a reference.

4. A measurement device in accordance with claim 3, wherein said control switching means employs a ramp waveform to cause a closing and opening of the first FET switch and second FET switch.

5. A measurement device in accordance with claim 4, wherein a clamping circuit is coupled between a connection of the capacitor and the resistor, and the output of the third error amplifier, thereby preventing erroneous operation of the first FET switch and second FET switch.

6. A measurement device in accordance with claim 1, wherein:

the first and second control means have FET switches connected between inputs and outputs of the first and the second error amplifiers, respectively; and said switching control switching means, during a time that the first or second control means is controlling the output voltage or output current, opens the FET switches, and after the third control means has started control by holding the output voltage, closes the FET switches in the first or second control means; thereby enabling a setting of values of the voltage range, a reference voltage for the output voltage, and a current range and/or a reference voltage for the output current; and immediately after the transitional period of the setting is completed, opens the FET switches in the first or second control means.

7. A measurement device in accordance with claim 1, wherein:

the first and second control means include a means for stopping the functions of the voltage-current converters; and said control switching means, after the third control means has started control by holding the output voltage, stops the functions of the voltage-current converters of the first and second control means, thereby enabling a setting of values of the voltage range, a reference voltage for the output voltage and a current range and/or a reference voltage for the output current, and immediately after a transitional period of the setting is complete, restores the functions of the voltage-current converters.

8. A measurement device comprising:

a current ranging circuit, connected to an output terminal, for detecting an output current flowing to a device under test (DUT) through said output terminal;

a power amplifier for driving the current ranging circuit;

an integrating circuit connected to the power amplifier;

a first control means, including an output voltage detection means for detecting a voltage at the output terminal, and providing an output indicative thereof to a first error amplifier to which a reference output voltage is connected through a voltage ranging circuit, said first error amplifier connected to the integrating circuit through a voltage-current converter;

at least a second control means, including output current detection means for detecting voltage at both ends of the current ranging circuit, and providing an output indicative thereof to a second error amplifier, to which a reference voltage produced by an output current through a resistor is also connected, said second error amplifier connected to the integrating circuit through a voltage-current converter;

a third control means including a voltage memory means, connected to the output voltage detection means and an input of a third error amplifier; and a control switching means, connected to the third error amplifier, the third error amplifier further connected to the integrating circuit through a voltage-current converter;

said control switching means enabling the first control means or the second control means to control the output voltage or output current and, in such case switching the third control means to a state in which the voltage memory means remembers the voltage of the output voltage detection means and the aforementioned output voltage is remembered; and when set values of either or both of the output voltage and output current are changed, first, the third control means is switched by the control switching means to a state to control the output voltage and then enables said third control means to hold the output voltage at the voltage remembered by the voltage memory means, and further causes the first and second control means to stop controlling, thereby enabling a subsequent changing of setting values for voltage and current; and after a transitional period of setting changes is completed, the control switching means stops the control operation of the third control means and enables a resumption of control by the first or second control means, and further operates the third control means to resume holding the voltage of the output voltage detection means.

9. A method for changing settings of voltage and/or current of measurement device, the method comprising the steps of:

a. providing an output voltage detection means;
b. providing a current ranging circuit;
c. providing a voltage ranging circuit;
d. providing a first control means for voltage including an output voltage detection means and voltage ranging circuit connected with a reference output voltage;
e. providing at least a second control means for current;
f. providing a third control means including a voltage memory means and a control switching means;
g. switching the third control means to a state in which the voltage memory means remembers the voltage of the output voltage detection means and the aforementioned output voltage is remembered, in case of said control switching means enabling the first control means or the second control means to control the output voltage or output current; and h. when set values of either or both of the output voltage and output current are changed, comprising the steps of:
   (i) switching the third control means to a state to control the output voltage;
   (ii) holding and remembering the output voltage with the voltage memory means in the third control means;
   (iii) stopping to control and changing of a voltage range, a reference voltage for the output voltage; a current range, and/or a reference voltage for the output current at the first and second control means;
   (iv) stopping the control operation of the third control means after a transitional period of setting changes is completed;
   (v) resuming controls of the first and second control means; and
   (vi) resuming holding the voltage of the output voltage detection means at the third control means.

10. A method in accordance with claim 9, wherein:

the voltage memory means is a capacitor and the control switching means of the third control means is an FET switch; and for said third control means upon operation by said control switching means, further comprising the steps of:
   (i) closing the FET switch to enable a charging of the capacitor to a voltage corresponding to the output voltage; and
   (ii) opening the FET switch to enable use of the capacitor voltage as a reference.

11. A method in accordance with claim 9, wherein:

the output voltage detection means is connected to a first terminal of a capacitor, and a second terminal of the capacitor is connected to an input terminal of a first error amplifier through the resistor, the input and output of the first error amplifier are connected by a first FET switch and ends of a resistor are connected by a second FET switch, an output of the first error amplifier is connected to a integrating circuit through a voltage-current converter; and further comprising the steps of:
   (i) closing the first FET switch and second FET switch to enable a charging of the capacitor to a voltage corresponding to the output voltage; and
   (ii) opening the first FET switch and second FET switch, and enables the capacitor voltage charge to be used as a reference.

12. A method in accordance with claim 10, wherein:

the first and second control means have a second and third error amplifiers, respectively, and have FET switches connected between inputs and outputs of the second and the third error amplifiers, respectively; and further comprising the steps of:
   (i) opening the FET switch in the third control means, during a time that the first or second control means is controlling the output voltage or output current;
   (ii) closing the FET switch in the first or second control means, after the third control means has started control by holding the output voltage;
   (iii) enabling a setting of values of the voltage range, a reference voltage for the output voltage, and a current range and/or a reference voltage for the output current in the first or second control means; and (iv) opening the FET switch in the first or second control means, immediately after the transitional period of the setting being completed.

13. A method in accordance with claim 10, wherein:

the first and second control means include a means for stopping the functions of the voltage-current converters; and further comprising the steps of:

(i) stopping the functions of the voltage-current converters of the first and second control means, after the third control means has started control by holding the output voltage;

(ii) enabling a setting of values of the voltage range, a reference voltage for the output voltage and a current range and/or a reference voltage for the output current; and (iii) restoring the functions of the voltage-current converters, immediately after a transitional period of the setting being completed.

* * * * *